US011099601B2

(12) United States Patent
Carlough et al.

(10) Patent No.: US 11,099,601 B2
(45) Date of Patent: Aug. 24, 2021

(54) REDUCING LATENCY OF MEMORY READ OPERATIONS RETURNING DATA ON A READ DATA PATH ACROSS MULTIPLE CLOCK BOUNDARIES, TO A HOST IMPLEMENTING A HIGH SPEED SERIAL INTERFACE

(71) Applicant: INTERNATIONAL BUSINESS MACHINES CORPORATION, Armonk, NY (US)

(72) Inventors: Steven R. Carlough, Poughkeepsie, NY (US); Susan M. Eickhoff, Hopewell Junction, NY (US); Michael B. Spear, Round Rock, TX (US); Gary A. Van Huben, Poughkeepsie, NY (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 16/556,206

(22) Filed: Aug. 29, 2019

(65) Prior Publication Data

US 2019/0384352 A1 Dec. 19, 2019

Related U.S. Application Data

(63) Continuation of application No. 15/866,838, filed on Jan. 10, 2018, now Pat. No. 10,698,440.

(51) Int. Cl.
*G06F 12/00* (2006.01)
*G06F 1/12* (2006.01)
(Continued)

(52) U.S. Cl.
CPC .................. *G06F 1/12* (2013.01); *G06F 1/08* (2013.01); *G06F 1/10* (2013.01); *G06F 13/1673* (2013.01);
(Continued)

(58) Field of Classification Search
None
See application file for complete search history.

(56) References Cited

U.S. PATENT DOCUMENTS 5,913,231 A 6/1999 Lewis et al.
6,496,043 B1 12/2002 Moss et al.
(Continued)

OTHER PUBLICATIONS

Notice of Allowance, dated Dec. 11, 2019, U.S. Appl. No. 15/866,838, filed Jan. 10, 2018, In re Carlough.
(Continued)

*Primary Examiner* — Daniel D Tsui
(74) *Attorney, Agent, or Firm* — Scott S. Dobson

(57) ABSTRACT

A calibration controller determines a latest arriving data strobe from at least one data chip at a first data buffer in a read data path between at least one memory chip and a host on a high speed interface. The calibration controller determines whether external feedback of the at least one data chip is required. The calibration controller, in response to determining that external feedback of the at least one data chip is required, aligns a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

20 Claims, 9 Drawing Sheets

(51) Int. Cl.
*G06F 1/10* (2006.01)
*G06F 1/08* (2006.01)
*G11C 7/22* (2006.01)
*G06F 13/16* (2006.01)
*H03L 7/085* (2006.01)

(52) U.S. Cl.
CPC .......... *G06F 13/1689* (2013.01); *G11C 7/222* (2013.01); *H03L 7/085* (2013.01); *G11C 2207/2254* (2013.01); *G11C 2207/2272* (2013.01)

(56) References Cited

U.S. PATENT DOCUMENTS

| | | | |
|---|---|---|---|
| 6,603,706 | B1 | 8/2003 | Nystuen et al. |
| 7,594,047 | B2 | 9/2009 | Luk |
| 7,886,174 | B2 | 2/2011 | Spry et al. |
| 7,934,057 | B1 | 4/2011 | Raza |
| 8,958,517 | B2 | 2/2015 | Su |
| 8,963,599 | B2 | 2/2015 | Dobbs et al. |
| 9,213,359 | B2 | 12/2015 | Prakash et al. |
| 9,497,050 | B2 | 11/2016 | Kain |
| 2012/0059958 | A1 | 3/2012 | Hnatko et al. |
| 2014/0337539 | A1 | 11/2014 | Lee et al. |
| 2016/0162404 | A1 | 6/2016 | Lee et al. |
| 2019/0212769 | A1 | 7/2019 | Carlough et al. |

OTHER PUBLICATIONS

Meixner et al., "External Loopback Testing Experiences with High Speed Serial Interfaces", Intel Corporation, International Test Conference, IEEE, 2008, 10 pages.
"POWER8 Memory Buffer, User's Manual", Apr. 22, 2014, Version 1.1, International Business Machines Corporation, 26 pages.
Notice of Allowance, dated Jun. 28, 2019, U.S. Appl. No. 15/866,838, filed Jan. 10, 2018, In re Carlough.
U.S. Appl. No. 15/866,838, filed Jan. 10, 2018, In re Carlough.
"List of IBM Patents or Patent Applications Treated as Related", dated Aug. 29, 2019, 2 pages.

REDUCING LATENCY OF MEMORY READ OPERATIONS RETURNING DATA ON A READ DATA PATH ACROSS MULTIPLE CLOCK BOUNDARIES, TO A HOST IMPLEMENTING A HIGH SPEED SERIAL INTERFACE

CROSS REFERENCE TO RELATED APPLICATIONS

This application is a continuation of commonly assigned U.S. patent application Ser. No. 15/866,838, filed Jan. 10, 2018, which is hereby incorporated herein by reference.

BACKGROUND

1. Technical Field

This invention relates in general to a memory system calibration and more particularly to reducing latency of memory read operations returning data on a read data path across multiple clock boundaries, to a host implementing a high speed serial interface.

2. Description of the Related Art

Computing systems generally include one or more circuits with one or more memory or storage devices connected to one or more processors via one or more controllers. Timing variations, frequency, temperature, aging and other conditions impact data transfer rates to and from memory or other storage, which impacts computer system performance. In addition, in a computer system where a host implements an serializer/deserializer (SerDes) based, high speed serial (HSS) interface for interfacing between a memory device operating under a first memory protocol and a host that is agnostic to the first memory protocol, for asynchronous read operations, timing variations between clock and data signals along a read data return path have the potential to significantly impact timing margins within the computer system.

BRIEF SUMMARY

In one embodiment, a method is directed to determining, by a computer system, a latest arriving data strobe from at least one data chip at a first data buffer in a read data path between at least one memory chip and a host on a high speed interface. The method is directed to determining, by the computer system, whether external feedback of the at least one data chip is required. The method is directed to, in response to determining that external feedback of the at least one data chip is required, aligning, by the computer system, a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

In another embodiment, a computer system comprises one or more processors, one or more computer-readable memories, one or more computer-readable storage devices, and program instructions, stored on at least one of the one or more storage devices for execution by at least one of the one or more processors via at least one of the one or more memories. The stored program instructions comprise program instructions to determine a latest arriving data strobe from at least one data chip at a first data buffer in a read data path between at least one memory chip and a host on a high speed interface. The stored program instructions comprise program instructions to determine whether external feedback of the at least one data chip is required. The stored program instructions comprise program instructions to, in response to determining that external feedback of the at least one data chip is required, align a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

In another embodiment, a computer program product comprises one or more computer-readable storage devices and program instructions, stored on at least one of the one or more storage devices. The stored program instructions comprise program instructions to determine a latest arriving data strobe from at least one data chip at a first data buffer in a read data path between at least one memory chip and a host on a high speed interface. The stored program instructions comprise program instructions to determine whether external feedback of the at least one data chip is required. The stored program instructions comprise program instructions to, in response to determining that external feedback of the at least one data chip is required, align a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth to provide a thorough understanding of the present invention. It will be apparent, however, to one skilled in the art that the present invention may be practiced without these specific details. In other instances, well-known structures and devices are shown in block diagram form to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
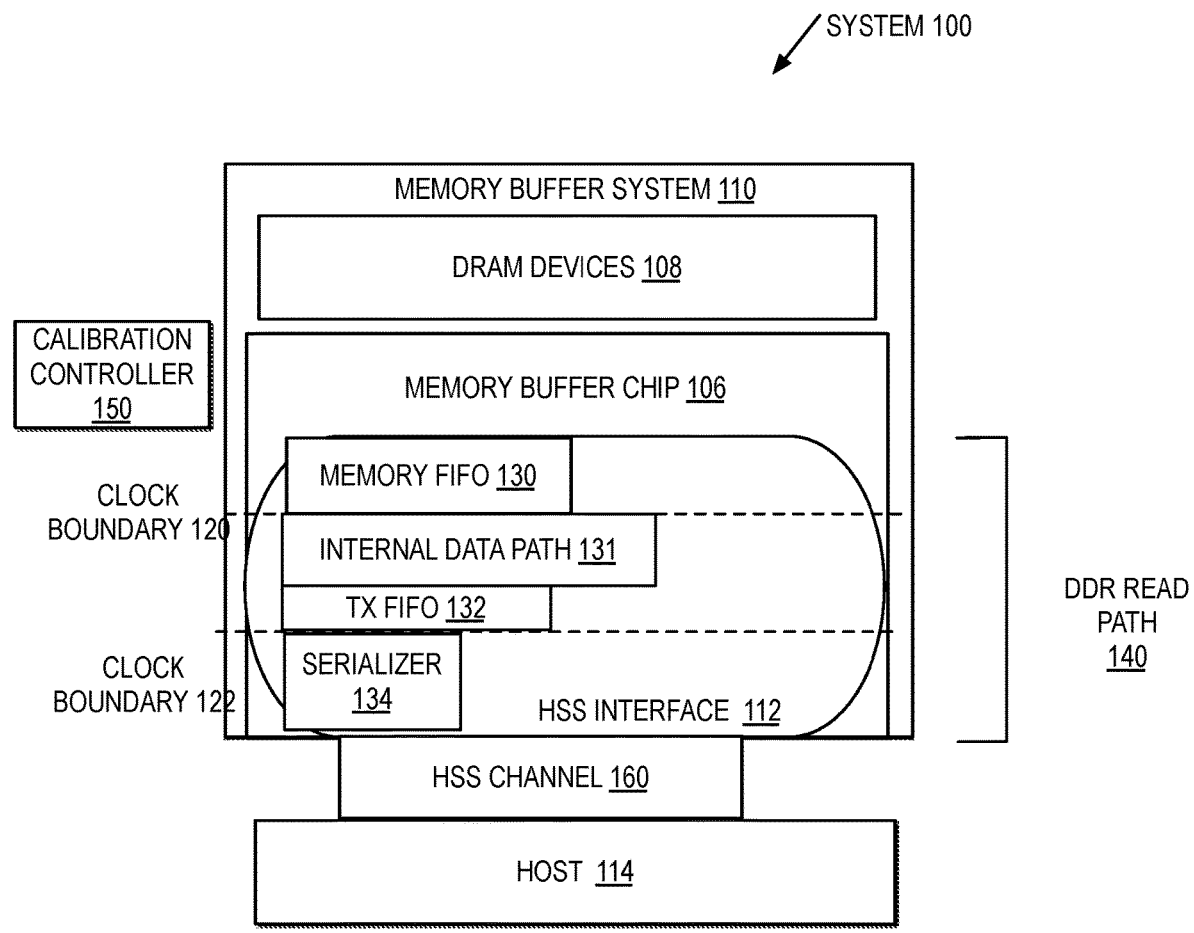
FIG. 1 is a block diagram illustrating one example of a system including multiple clock boundaries between at least one memory buffer system and a host, across an HSS interface.

FIG. 1 illustrates a block diagram of a system including multiple clock boundaries between at least one memory buffer system and a host, across an HSS interface.

In one example, a system 100 may include one or more memory buffer systems, such as a memory buffer system 110, connected to one or more hosts, such as a host 114, implementing one or more SerDes based connections, such as an HSS channel 160, connected to a HSS interface 112 of memory buffer system 110. In one example, memory buffer system 110 may represent a disparate memory system from host 114. For example, memory buffer system 110 may implement a synchronous double data rate (DDR) protocol and host 114 may represent a device that is agnostic to any particular memory protocol and employs HSS channel 160 to control data transfers between one or more memory chips and host 114. In one example, HSS channel 160 may represent multiple differential high-speed uni-directional channels. In one example, HSS interface 112 may serialize data received from a parallel interface of memory buffer system 110, for access by HSS channel 160 of host 114. In one example, a SerDes connection implemented in HSS interface 112 and HSS channel 160 may represent one or more pairs of functional blocks which may be used in high speed communications to convert data between serial data interfaces and parallel interfaces in each direction. In one example, HSS interface 112 may include one or more of a parallel in serial out (PISO) block and a serial in parallel out (SIPO) block, configured in one or more different architectures, incorporating one or more types of clocks. In one example, HSS interface 112 may provide data transmission to HSS channel 160 over a single line to minimize the number of I/O pins and interconnects required for an interface.

Figure 2:
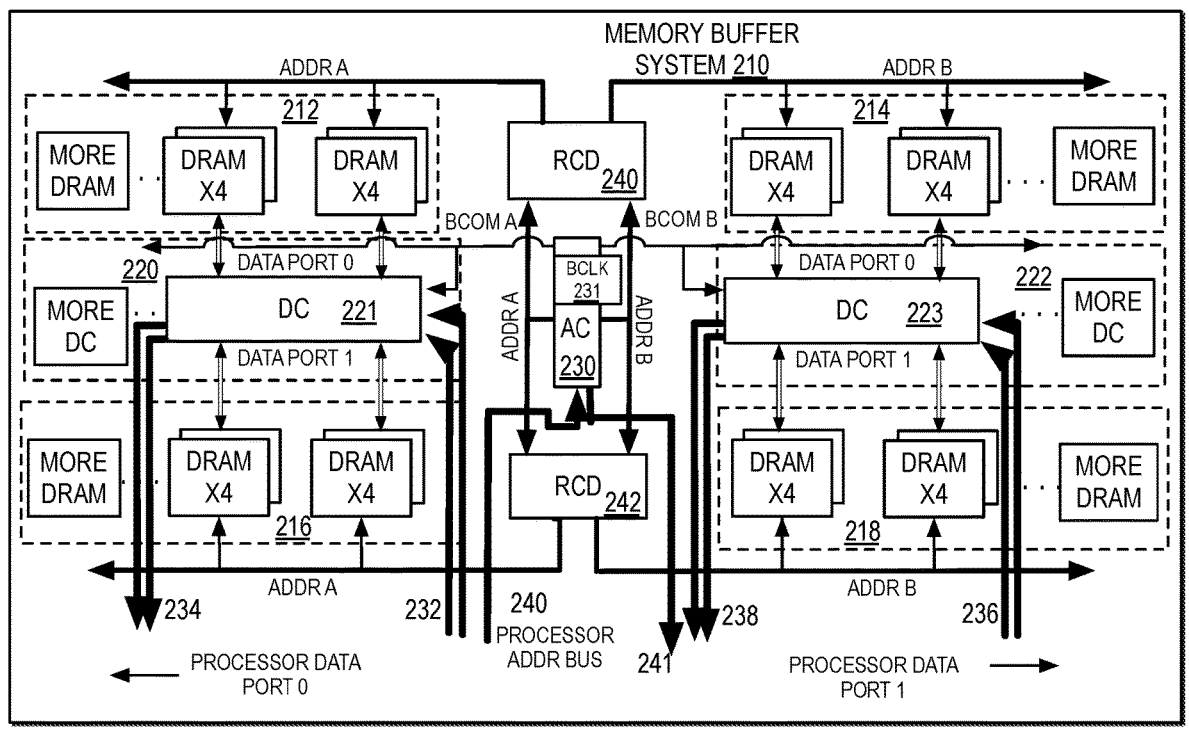
FIG. 2 is a block diagram illustrating one example of a memory buffer system configured in a distributed memory buffer topology with a dedicated connection to an HSS interface.
Figure 3:
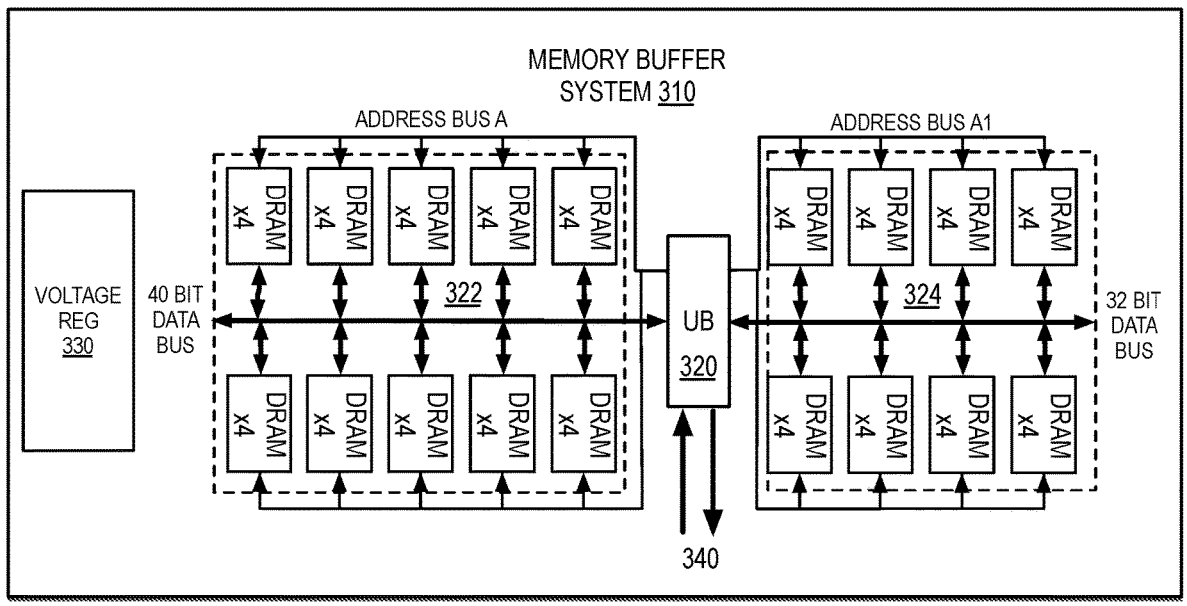
FIG. 3 is a block diagram of one example of a memory buffer system configured in a unified memory buffer topology with a dedicated connection to an HSS interface.

In one example, memory buffer system 110 may control multiple dynamic random-access memory (DRAM) devices 108, which may also be referred to as memory chips. One or more memory buffer chips, such as memory buffer chip 106 of memory buffer system 110, may be configured in one or more topologies connected to DRAM device 108, including, but not limited to a distributed memory buffer topology, such as a distributed memory buffer topology as illustrated in FIG. 2, and a unified memory buffer topology, such as a unified memory buffer topology as illustrated in FIG. 3. In one example, as described herein, DRAM devices 108 may generally refer to one or more types of memory including, but not limited to, traditional DRAM, static random access memory (SRAM), and electrically erasable programmable read-only memory (EEPROM), and other types of non-volatile memories. In one example, memory buffer system 110 may represent one or more dual in-line memory modules (DIMMMs) or registered dual in-line memory modules (RDIMMs) implementing double data rate (DDR) synchronous DRAM (SDRAM), such as, but not limited to, DDR type three (DDR3) SDRAM and DDR type four (DDR4) SDRAM. In one example, memory buffer system 110 may represent one or more of, or a combination of, one or more integrated circuits (ICs), one or more application specific ICs (ASICs), and one or more microprocessors. In additional or alternate examples, memory buffer system 110 may represent any type of system that transmits data bidirectionally or unidirectionally between a controller and a chip.

Synchronizing input signals from one chip clock domain to another chip clock domain between memory buffer system 110 and host 114 may require one or more asynchronous boundary crossings. The asynchronous boundary crossings may increase the latency in a path, which decreases the performance of systems with chip crossings. For example, memory buffer system 110 may include a dedicated connection through memory buffer chip 106 to SerDes based, HSS interfaces, such as HSS interface 112, for connecting to a host that employs an HSS interface, such as HSS channel 160 of host 114. In one example, to accommodate for read request responses to asynchronous read requests through the dedicated connection from memory buffer system 110 to host 114 through HSS interface 112, system 100 may implement a DDR read path 140 that includes additional data buffers for gating data and other components along the data path between memory buffer system 110 and host 114 through HSS interface 112. In particular, the additional data buffers may be implemented to compensate for skews in phase alignment between clock signals and data signals within memory buffer system 110.

In one example, the additional data buffers implemented in the dedicated path of HSS interface 112 may include first in first out data buffers, such as a memory FIFO 130, of memory buffer system 110, and a transmit (TX) FIFO 132, of HSS interface 112. In one example, memory FIFO 130 receives data sampled by memory buffer system 110 in a DDR protocol, such as DQ data sampled by DQS strobe signals, in a first clock domain. The data from memory FIFO 130 may pass across a clock boundary 120 of the first domain, through an internal data path 131 to TX FIFO 132, operating in a second clock domain. The data from TX FIFO 132 may pass across a clock boundary 122 of the second clock domain, to a serializer 134, operating in third clock domain. In the example, to compensate for the phase misalignment between clock signals and data signals of memory buffer system 110, DDR read path 140 may include one or more elements to synchronize the data as the data cross clock boundary 120 and clock boundary 122. For example, internal data path 131 may add one or more additional cycles between a read pointer reading data from memory FIFO 130 into TX FIFO 426 and serializer 134 may add one or more additional cycles between data being loaded into memory TX FIFO 426 and an unload pointer reading data out of TX FIFO 426 into serializer 134. In one example, serializer 134 may convert the data received in a DDR protocol into a protocol for transmission on a HSS channel 160, and place the converted data on HSS channel 160 for access by host 114.

In the example, in transferring data from memory buffer system 110 to host 114, the transfer of data is illustrated crossing two separate clock boundaries, illustrated by clock boundary 120 and clock boundary 122, where each clock boundary may represent a transition across a data buffer controlled by one clock signal, in one domain, into another clock domain, controlled by a different clock signal. In additional or alternate embodiments, the transfer of data from memory buffer system 110 to host 114 may cross additional clock boundaries, such as three or more separate clock boundaries.

In the example, the addition of data buffers, and data passing through a clock boundary at each data buffer in DDR read path 140 in HSS interface 112, introduces additional latency into the overall latency of the read data return path. The additional latency may increase significantly in the event of any non-optimal clock alignment between the clock boundaries that necessitates stalling data in each data buffer for one or more clock cycles. In one example, the overall system latency of a return data path may be measured as a function of how long host 114 waits, after sending an asynchronous read request, for a read tag response from memory buffer system 110, where subsequent to host 114 receiving the read tag response, the corresponding data are guaranteed to return N cycles later. While memory buffer system 110 may be controlled under a timing protocol, such as a Joint Electron Device Engineering Council (JEDEC) timing protocol, where within memory buffer system 110, data and control latency relationships are required to be maintained across data buffer chips, in the present invention, data are transmitted outside the boundaries of the memory protocol controlling memory buffer system 110 to a memory protocol agnostic host and are required to traverse multiple FIFOs, over multiple clock boundaries, to arrive at host 114, introducing additional latency to the end-to-end read data path. In one example, the additional latency introduced by transferring data across each clock boundary may include multiple memory clock cycles, which accumulates to an amount of delay that appreciably impacts performance of read accesses from memory buffer system 110 by host 114.

In the present invention, the overall system performance of system 100 may be optimized by minimizing the read data latency from memory buffer system 110 to host 114 through DDR read path 140 of HSS interface 112. In one example, the overall read data path latency, from memory buffer system 110 to HSS channel 160 of host 114, via HSS interface 112, may be minimized by optimizing the wait time from when host 114 sends a read data request to the cycle that host 114 receives a read tag response, across multiple clock boundaries, such as clock boundary 120 and clock boundary 122. In particular, in the present invention, the overall read data path latency may be minimized by optimizing the intermediate data transfers through memory FIFO 130 and TX FIFO 132, along internal data path 131, to serializer 134, allowing the read tag response to be potentially returned one or more cycles earlier than if no optimization is performed. By optimizing the intermediate data transfers through memory FIFO 130 and TX FIFO 132, the overall system latency of memory read operations across multiple clock boundaries is reduced, thereby minimizing read data latency within system 100.

In the present invention, the memory controller and associated memory interface maintenance and calibration functions may be initiated and contained within memory buffer system 110. For example, a calibration controller 150 may manage calibration and training functions within memory buffer system 110. In one example, each step in an initialization or calibration sequence may be disabled or skipped by using a configuration bit.

In the present invention, the intermediate data transfers through memory FIFO 130 and TX FIFO 132 may be optimized through optimizing a training sequence performed by calibration controller 150 for aligning clock phases for controlling clock boundaries at memory FIFO 130 and TX FIFO 132, along with managing external feedback, and by optimizing the configuration of one or more components of memory FIFO 130, internal data path 134, TX FIFO 132, and serializer 134. In particular, in a typical DDR memory interface system, the phase relation between a data strobe that controls a clock of memory FIFO 130, a chip clock that controls timing through internal data path 134 and TX FIFO 132, and an HSS clock that controls timing by serializer 134, during read operations, may initially be unknown. In one example, calibration controller 150 may utilize dedicated circuits of memory buffer system 110 or circuits separate from memory buffer system 110 within system 100 for performing system initialization and training to reduce the latency in DDR read path 140 by aligning clock phases for controlling clock boundaries at FIFO 130 and TX FIFO 132. In one example, aligning clock phases may include one or more of inverting a clock or adjusting the phase of a clock.

In one example, calibration controller 150 may be implemented in conjunction with or separately from additional initialization and training of memory buffer system 110 performed to calibrate read and write controls of memory buffer system 110 by calibrating the voltages and frequencies received by components for read and for writes within memory buffer system 110. For example, during read calibration, calibration controller 150 may optimize the gating of the arriving strobe by memory FIFO 130, align the data bits received by memory FIFO 130 with the strobe, and center the strobe within the data eye. In one example, each data bit may have its own strobe, thereby enabling a phase rotator to align each DQ individually. In one example, during write calibration, calibration controller 150 may include a fine write leveling step for aligning the strobe with respect to a memory clock and a coarse write leveling step to adjust the strobe into a correct logical write cycle. In addition, read calibration and write calibration may include additional or alternate steps. In one example, memory buffer system 110 may operate over a range of one or more conditions, including a range of voltage settings, a range of frequency settings, a range of timing settings, and a range of temperature refresh rates. Additional conditions that may impact operation of memory buffer chip 110 include timing, aging, and temperature.

In one example, in addition to calibration controller 150 performing clock inversions or phase alignments to minimize the latency incurred from intermediate data transfers through memory FIFO 130 and TX FIFO 132 across multiple clock boundaries, system 100 may also implement additional system optimization control to minimize read data latency. For example, system 100 may include controllers in memory buffer system 110, HSS interface 112 and host 114 that minimize read data latency by minimizing the number of read data requests or read tag responses transferred through system 100, such as by optimizing the scheduling of read data requests by host 114 into more efficient memory data access sequences that reduce cumulative read data latency. For example, memory buffer system 110 may detect two or more memory data fetches from one or more hosts targeting data within a common memory region and schedule the read data requests in an efficient memory data access sequence that reduces overall read data latency.

In one example, while system 100 may also be configured and optimized for managing synchronous read data requests where read tag responses to read requests are delivered back to a host on a precisely determined cycle, in the example, calibration controller 150 may optimize memory buffer system 110 for minimizing read data latency from asynchronous read data protocol requests from host 114, by optimizing the intermediate data transfers through memory FIFO 130 and TX FIFO 132, to allow the read tag response to be potentially returned one or more cycles earlier than if not optimized.

FIG. 2 illustrates a block diagram of one example of a memory buffer system configured in a distributed memory buffer topology with a dedicated connection to an HSS interface.

In one example, a memory buffer system 210 may include multiple circuit elements, including, but not limited to, multiple DRAM devices and memory buffer chips configured in a distributed memory buffer topology, with a dedicated connection to an HSS interface. In one example, memory buffer system 210 includes multiple sets of DRAM devices illustrated by a DRAM set 212, DRAM set 214, DRAM set 216, and DRAM set 218, which may be implemented in DRAM devices 108. In one example, each set of DRAM devices illustrated may include multiple DRAM chips, such as the two DRAM chips illustrated and more DRAM chips, including, but not limited to, 8 more DRAM chips. In additional or alternate examples, memory buffer system 210 may include additional or alternate sets of DRAM chips and numbers of DRAM chips.

In one example, memory buffer system 210 may include one or more chips which may be implemented in memory buffer chip 106, including, but not limited to, an address/command (AC) chip 230, for processing command, address, and control information and one or more data chips (DC)s, for processing data. In one example, memory buffer system 210 includes a DC set 220 of multiple DCs, such as DC 221, and a DC set 222 of multiple DCs, such as DC 223. In additional or alternate embodiments, memory buffer system 210 may include additional AC chips and additional or alternate DC chips.

In one example, each of AC chip 230 and the DC chips in DC set 220 and DC set 222 have dedicated SERDES connections for interfacing with an HSS interface to an HSS channel. In one example, AC chip 230 has a dedicated HSS interface connection 240 to a processor address bus and a dedicated HSS interface connection 241 back to the host for sending back responses, error indicators, interrupts, and other types of responses. In addition, in one example, DC 221 has dedicated HSS interface connections illustrated by inputs 232 and outputs 234 and DC 223 has dedicated HSS interface connections illustrated by inputs 236 and outputs 238. In one example, each of pair of inputs 232, inputs 236, outputs 234 and outputs 238 includes a connection to a "processor data port 0" and a "processor data port 1". In one example, the data output from outputs 234 and outputs 238 may represent data signals, referred to as DQ.

In one example, AC chip 230 may have connections to each of the DRAMs through Register Clock Driver (RCD) devices, such as RCD 240 and an RCD 242. For example, AC chip 230 may connect to each of the DRAM through one of RCD 240 and RCD 242, either through a connection labeled "addr A" or "addr B". In one example, each of RCD 240 and RCD 242 may represent an address and control buffer that generate command sequences for driving each of the DRAM. For example, AC 230 may connect to DRAM set 212 through RCD 240 on "addr A", AC 230 may connect to DRAM set 214 through RCD 240 on "addr B", AC 230 may connect to DRAM set 216 through RCD 242 on "addr A", and AC 230 may connect to DRAM set 218 through RCD 242 on "addr B". In one example, RCD 240 and RCD 242 may be implemented in memory buffer system 210 to handle electrical loading, depending on the number of DRAMs present and the operational frequency of memory buffer system 210. In additional or alternate embodiments, memory system 210 may be implemented without RCD 240 and RCD 242. For example, where memory buffer system 210 is contained in a DIMM, the signal lengths may be short enough to allow AC 230 to communicate directly with the command (cmd)/address (addr), and control (cntrl) I/O of the DRAMs directly, rather than require the electrical drive capacity provided by passing through RCD 240 and RCD 242, such as an example including distributed buffers mounted on a system planar and driving through a connector to Industry Standard DIMMs.

In one example, each of the DC chips in DC set 220 and DC set 222 have synchronous DRAM DDR connections to one or more DRAMs. For example, each DC chip connects to a pair of DRAM on a "data port 0" and a pair of DRAM on a "data port 1". In one example, DC 221 may have synchronous DDR connections to a pair of DRAM in DRAM set 212 on a "data port 0", DC 221 may have synchronous DDR connections to a pair of DRAM in DRAM set 216 on a "data port 1", DC 223 may have synchronous DDR connections to a pair of DRAM in DRAM set 214 on a "data port 0", and DC 223 may have synchronous DDR connections to a pair of DRAM in DRAM set 218 on a "data port 1".

In one example, each of AC chip 230 and the DC chips in DC set 220 and DC set 222 have dedicated SERDES connections for interfacing with an HSS interface. In one example, AC chip 230 has a dedicated HSS interface connection 240 to a processor address bus. In addition, in one example, DC 221 has dedicated HSS interface connections illustrated by inputs 232 and outputs 234 and DC 223 has dedicated HSS interface connections illustrated by inputs 236 and outputs 238. In one example, each of pair of inputs 232, inputs 236, outputs 234 and outputs 238 includes a connection to a "processor data port 0" and a "processor data port 1". In particular, in the example, outputs 234 and outputs 238 may represent dedicated DDR read paths to one or more HSS interfaces.

In one example, AC chip 230 is connected to each of the DC chips in DC set 220 and DC set 222 for sending data buffer commands through a broadcast communication bus (BCOM). For example, AC 230 broadcasts information to DC 221, and other DC chips in DC set 220 on "BCOM A" and broadcasts information to DC 223, and other DC chips in DC set 222 on "BCOM B".

In one example, memory buffer system 210 may include one or more clock topology configurations. For example, AC 230 may generate a broadcast clock (BCLK) signal, from a BCLK 231. In one example, each of RCD 240 and RCD 242, or AC 230 if RCDs are not implemented, may broadcast information to all the DRAM within memory buffer system 210 using a common clock and communication path, with the common clock driven by BCLK 231. In one example, the common clock driven by BCLK 231 may drive a DC phase locked loop (PLL), which drives a DQS signal for data output on outputs 234 and outputs 238, and the PLL may drive an internal DC chip clock.

FIG. 3 illustrates a block diagram of one example of a memory buffer system configured in a unified memory buffer topology with a dedicated connection to an HSS interface.

In one example, a memory buffer system 310 may include multiple circuit elements, including, but not limited to, multiple DRAM devices and a memory buffer chip configured in a unified memory buffer topology. In one example, the unified memory system topology represents an Open-CAPI architecture that allows any microprocessor attached to advanced memories accessible via read/write or user-level DMA semantics.

In one example, memory buffer system 310 is illustrated with multiple sets of DRAM devices illustrated by a DRAM set 322 and DRAM set 324, which may be implemented in DRAM devices 108, a unified memory buffer (UB) 320, which may be implemented in memory buffer chip 106, and a voltage regulator (reg) 330 for driving the power grid of memory buffer system 310. In one example, each set of DRAM devices illustrated may include multiple DRAM chips. For example, DRAM set 322 illustrates 10 DRAM chips connected on a 40 bit data bus to UB 320 and DRAM set 324 illustrates 8 DRAM chips connected on a 32 bit data bus to UB 320. In one example, UB 320 may control an address bus, illustrated as "address bus A" to the DRAM chips in DRAM set 322 and as "address bus A1" to the DRAM chips in DRAM set 324.

In one example, UB 320 may include a dedicated DDR read path for connecting memory buffer system 310 to a host through an HSS interface, illustrated by connections 340. In additional or alternate embodiments, UB 320 may include additional or alternate components and connections.

Figure 4:
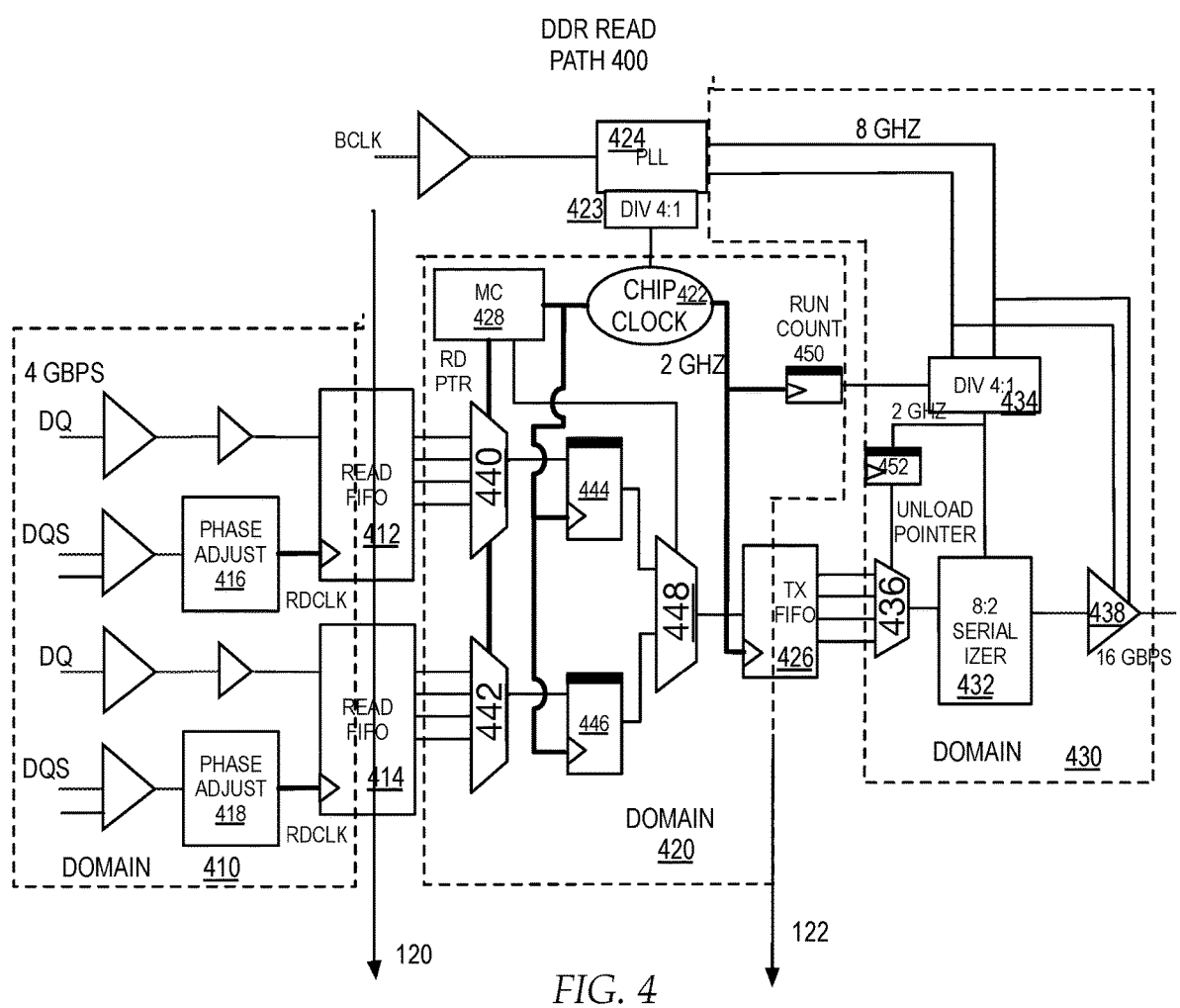
FIG. 4 illustrates a block diagram of one example of a general implementation of a DDR read path of an HSS interface within a memory buffer system.

FIG. 4 illustrates a block diagram of one example of a general implementation of a DDR read path of an HSS interface within a memory buffer system.

In one example, a DDR read path 400 may require data to cross multiple clock boundaries, illustrated by clock boundary 120 and clock boundary 122, where each clock boundary is illustrated between a different clock domain. In one example, DDR read path 400 may include additional or alternate clock boundaries and additional or alternate domains.

In one example, a first domain 410 may represent memory FIFO 130, providing an interface for latching read request response data signal "DQ" from a DRAM chip to a read FIFO 412 and a read FIFO 414. In one example, read FIFO 412 may represent a stack of FIFOs or FIFO buffer asynchronously receiving data from a different port of a distributed buffer or unified buffer memory topology. In one example, each of read FIFO 412 and read FIFO 414 include a RDCLK signal that controls a clock for buffering data from data signal "DQ". In one example, the RDCLK is driven by a data strobe signal "DQS". In one example, DQS is a data strobe signal generated in a DDR DRAM interface, such as is illustrated in FIG. 2 and FIG. 3. In one example, the DQS may be generated by an internal clock of each DC and a phase locked loop (PLL) 424 inside the DC sets used to generate and align the DQS to outgoing data DQ. In one example, there may be a skew between the DQS signals arriving at each of the read FIFOs. In one example, a phase adjust 416 and phase adjust 418 may be implemented to phase align the DQS signals generated by each DC, as a way of centering each DQS edge to capture read data within a data valid window. In one example, DQS may be phase aligned with incoming DQ data, in combination with buffering the DQ data through two buffers, so that each of read FIFO 412 and read FIFO 414 may clock in and buffer data on a positive and negative edge of the DQS signal.

In one example, each of the DQS signals may have rising and falling edges during different clock cycles or during different phases of a same clock cycle, leading to read FIFO 412 and read FIFO 414 clocking DQ at different times. A DDR read, in DDR protocol, may include reading out from read FIFO 412 and read FIFO 414 in parallel. In the example, the skew between DQS signals may cause skew between the data strobes of the DQS inputs to each of read FIFO 412 and read FIFO 414, such that the latest arriving strobe from each DQS signal controls the end of each lane read and the latest arriving strobe may arrive one or more clock cycles after the earlier data strobe.

In one example, a second domain 420, may represent internal data path 131 and TX FIFO 132. In one example, second domain 420 includes a read pointer (RD PTR) that controls reading data out of read FIFO 412 and read FIFO 414, across clock boundary 120 through a selection of a 4:1 multiplexer(mux) 440 and flip flop 444 or a 4:1 mux 442 and flip flop 446, followed by a 2:1 mux 448, before buffering in TX FIFO 426.

In one example, a clock signal controlling data flow through domain 420 is controlled by a chip clock 422, which distributes a DC chip clock. In one example, chip clock 422 receives an output from PLL 424, divided by a divider 423 into a single output running four times slower than the input from PLL 424. In one example, PLL 424 may implement a voltage controlled oscillator to adjust a timing relationship between an input clock signal, such as a buffered BCLK signal, and output data. In one example, divider 423 may divide an 8 Ghz signal into a slower 2 Ghz signals, to accommodate for phase misalignments between BCLK, such as the internal clock of AC 230, and the latest arriving strobe from DQS. In particular, by slowing down the signals, more time is allowed through domain 420 to accommodate for phase misalignments.

In one example, an MC 428 in domain 420 receives the clock signal from chip clock 422. MC 428 may control a read pointer (RD PTR) for read data out of read FIFO 412 into mux 440 and for read data out of read FIFO 414 into mux 442. In one example, the RD PTR may control which beats of data to read out of read FIFO 412 and read FIFO 414. In one example, each read FIFO may hold 2 beats of data and each DRAM may return 8 beats of data, so the RD PTR may cycle through 4 entries to obtain a cohesive line of data. In addition, MC 428 may control a clock signal to clock the output from mux 440 into flip flop 444 and the output from mux 442 into flip flop 446. In addition, MX 428 may control a signal to select data from the 2:1 mux 448 for switching between ports for buffering in TX FIFO 426 for multi-port configurations. In one example, TX FIFO 426 receives a clock signal from chip clock 422 for controlling buffering of data from mux 448. In addition, a run_count strobe 450 and unload pointer 452 receive a clock signal for controlling each flip flop from chip clock 422. In particular, by adding clocked elements, such as flip flop 444 and flip flop 446, additional clock cycles of latency are added to accommodate for phase misalignments.

In one example, a third domain 430 may represent serializer 134. In one example, third domain 430 includes an unload pointer that controls reading data out of TX FIFO 426, across clock boundary 122 through a selection of a 4:1 mux 436, an 8:2 serializer 432, and a frequency amplifier 438. In one example, in third domain 430, a 4:1 divider 434 divides a signal from 8 Ghz to 2 Ghz. In one example, unload pointer 452 is a counter clocked by the 2 Ghz signal from 4:1 divider 434 in domain 430. In one example, a run_count strobe 450 may select between the different phases of divided clock signal of 4:1 divider 434, for controlling the phase of the unload pointer 452 to mux 436. Mux 436 outputs data to an 8:2 serializer 432, which converts parallel data into serialized data and outputs the serialized data to amplifier 438, which increases the signal frequency to the frequency output by PLL 424. In the example, the path from 4:1 divider 434 to unload pointer 452, through mux 426 and back to serializer 432 is synchronized.

In the example, each of read FIFO 412 and read FIFO 414 at clock boundary 120 and TX FIFO 126 at block boundary 122 are positioned to absorb phase misalignment between BCLK and DQS. In particular, one limitation of DDR read path 400 is that when operating, there will be skew between BCLK and DQS signals. In addition, even though the unload pointer in domain 430 and the read clock into TX FIFO 426 in domain 420 are technically driven by PLL 424, the same PLL, because of differences in physical distribution in a system, the domains have the same clock source, but with different alignments of the clock source.

This misalignment, as illustrated in FIG. 4, is compensated for by sufficiently separating the unload pointer in domain 430 from the RD pointer in domain 420 by a certain number of clock cycles to ensure data stability before reading the data into a serializer. Adding the clock cycles to separate the pointers increases latency. In addition, this misalignment, as illustrated in FIG. 4, is compensated for by divider 434 of domain 430 dividing the 8 Hz signal, and taking 1 of 4 possible phases of an 8 Hz signal during chip initialization, as set by run count 450, which increases the chances of non-optimal alignment across the DC clock boundaries. As illustrated in FIG. 4, the SERDES FIFO may absorb this misalignment by way of increasing the unload time with respect to the loading of the TX FIFO 426, thereby further increasing the data return latency.

In the present invention, calibration controller 150 may optimize the DDR read path 400 by aligning the phases between the DQS strobe in domain 410, chip clock 422 in domain 420, and the HSS clock driving the unload pointer in domain 430. In one example, calibration controller 150 may align the chip clock 422 to the latest arriving DQS strobe and then align the HSS clock driving the unload pointer in domain 430 to chip clock 422, to minimize the latency on DDR read path 400.

In particular, calibration controller 150 may initially start by starting AC clocks, such as BCLK 231 of AC 230, sending the BCLK signal to each of the DC chips of DC set 220 and DC set 222, and initializing a BCOM connection between AC 230 and each of the DC chips, including initializing each of the DC chips. Next, calibration controller 150 may train an AC HSS link, which may also be referred to as the downstream path, skipping the DC HSS link training, which may also be referred to as the upstream path, by setting a bit not to perform the DC HSS training yet because at this point, training the link between the DC chips and the host would likely result in non-optimized clock crossings. In one example, training an AC HSS link may include setting run_count 450, which selects a phase of 4:1 divider 434 to output for controlling the unload pointer. Thereafter, calibration controller 150 may perform memory interface initialization, including read and write calibration, using the AC HSS link and BCOM link. In one example, read calibration may include identifying a latest arriving strobe when centering DQ and DQS signals into read FIFO 412 and read FIFO 414.

In one example, calibration controller 150 may determine whether external feedback control is required. For example, in a distributed buffer memory topology illustrated in FIG. 2, external feedback control may be required. In a unified buffer memory topology illustrated in FIG. 3, external feedback control may not be required. In one example, a PLL feedback path illustrated in FIG. 7, may be added to PLL 424 to accommodate for external feedback control requirements in FIG. 4, in response to calibration by calibration controller 150, depending on the memory buffer topology. In one example, external feedback may be required in a distributed memory buffer topology to keep the relative phase of PLL 424 across multiple DC chips, to keep the chips from drifting with respect to one another, but PLL 424 locks the phase after initialization, so a PLL feedback path is required to adjust the phase after initialization for aligning chip clock 422 with a data strobe.

In one example, if external feedback control is not required, calibration controller 150 may adjust a phase of chip clock 422, also referred to as a DC chip clock, to align to the latest strobe and may adjust DC chip write clock phase rotators. In particular, adjusting a phase of chip clock 422 to align to the latest strobe minimizes the amount of time the read data must remain in read FIFO 412 and read FIFO 414 before it can be unloaded and transmitted to TX FIFO 426. However, the DC chip clock adjustment may upset the prior relationships that were established during memory interface calibration, thereby obviating several results. To compensate for the adjustments, the AC chip memory write clock and command/address/control phase rotators may be adjusted by an amount corresponding to the applied DC chip clock phase shift. In the example, the DC clocks may be shifted with any desired granularity depending on the implementation complexity. For example, delay lines may be used to provide four phases separated by 90 degrees, or phase rotators could be used to achieve a larger number of phases.

In one example, if external feedback is required, prior to adjusting the phase of chip clock 422 to align to the latest strobe and adjusting DC chip write clock phase rotators, calibration controller 150 may first implement a PLL feedback path with equal delay to adjust the phase of chip clock 422.

In one example, to determine the latest strobe, one or more of hardware and software may be implemented. In one example, read data path 400 may include additional hardware circuits for monitoring the DQS signals to identify the latest arriving strobe. In another example, software or firmware may capture information about each DQS strobe and capture the delay information, analyze the captured information, and determine which DQS is the latest strobe.

In one example, following the adjustment of the phase of chip clock 422, calibration controller 150 may perform the DC HSS training step using newly adjusted chip clock 422 to tune the HSS clock to launch the unload pointer by tuning a phase of 4:1 divider 434. In one example, calibration controller 150 may calibrate the phase of 4:1 divider 434, for controlling the HSS clock, using a current phase of run_count strobe 450, as driven by the recently adjusted phase of chip clock 422. The calibrated phase of 4:1 divider 434 drives the phase of unload pointer 452, triggering the unload pointer to unload mux 436. By calibrating the phase of 4:1 divider 434 using a current phase of run_count strobe 450, the phase of chip clock 422 driving data to be written into TX FIFO 426 is calibrated with respect to the phase of unload pointer 452 for triggering the unload pointer to unload data from TX FIFO 426, to minimize the time from when the data are written into TX FIFO 426 to when the data are unloaded from mux 436 and transmitted to the host.

Figure 5:
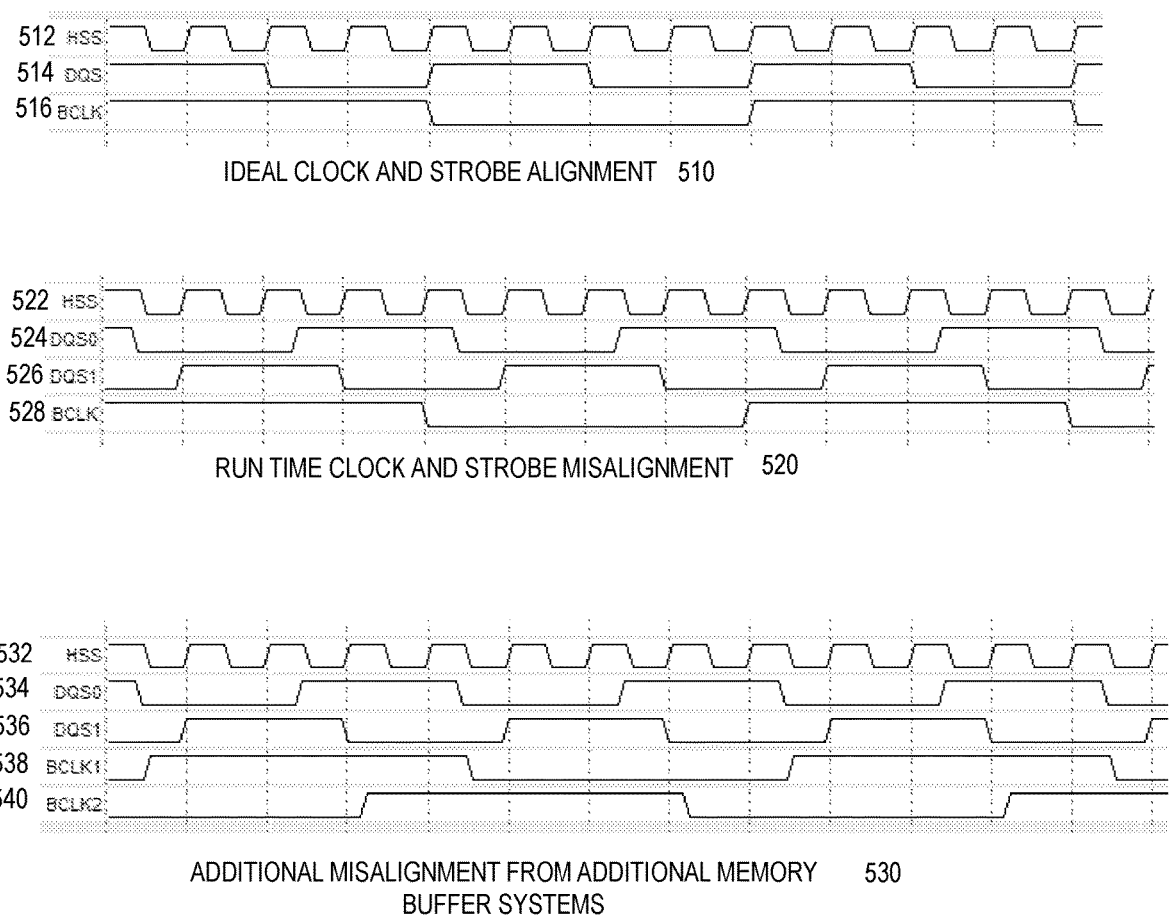
FIG. 5 illustrates a timing diagram of one example of an ideal clock and strobe alignment compared with a run time clock and strobe misalignment to be minimized by a calibration controller to minimize read data latency between a memory buffer system and a host, across an HSS interface.

FIG. 5 is a timing diagram illustrating one example of an ideal clock and strobe alignment compared with a run time clock and strobe misalignment to be minimized by a calibration controller to minimize read data latency between a memory buffer system and a host, across an HSS interface.

In one example, a timing diagram 510 illustrates an example of an ideal clock and strobe alignment in FIG. 4, in an example including an HSS signal, which may represent the signal received by 4:1 divider 434 in domain 430, a DQS signal, such as the DQS signal inputs to read FIFO 412 and read FIFO 414, and a BCLK signal. In a first example, the rising and falling edges of HSS signal 512, DQS signal 514, and BCLK 516 are aligned in an ideal clock and strobe alignment.

In one example, a timing diagram 520 illustrates an example of the clock and strobe misalignment that may occur at runtime in FIG. 4 because the incoming DQS signal to one read FIFO for clocking a nibble or byte of DQ data may be skewed with respect to the incoming DQS signal to another read FIFO for clocking a nibble or byte of DQ data. In one example, HSS signal 522 is illustrated as a signal consistent with HSS signal 512 in timing diagram 510 and BCLK 529 is illustrated as a clock signal consistent with BCLK 516, however, in a run time environment, the DQS signals into read FIFO 412 and read FIFO 414 are not aligned. For example, DQS0 signal 524 may control a RDCLK into read FIFO 412 and DQS1 signal 526 may control a RDCLK into read FIFO 414. In the example, in timing diagram 520, the strobe from DQS0 524 and the strobe from DQS1 526 are not aligned with one another, and are also not aligned with rising or falling edges of the clock signals of HSS signal 522 and BCLK 528. In real time operation, the strobes from DQS0 524 and DQS1 526 may be skewed across multiple nibbles or bytes, introducing additional clock cycles of latency into the read data path, requiring additional cycles of latency to be added between clock boundaries to accommodate for data strobes to trigger clocking of data at different clock times, and to wait for a latest arriving strobe for a lane of data read out in a DDR protocol, to deskew and align data such that a cohesive cache line can be delivered.

In one example, a timing diagram 530 illustrates an example of additional clock and strobe misalignments that may occur at runtime in FIG. 4 if additional memory buffer chips are added in a multi-port structure, with multiple DC chips. In one example, as additional memory DC chips are added in a multi-port system, in addition to the DQS skew introduced in timing diagram 520, additional skew is introduced because the incoming BCLK signal on one DC chip may be skewed with respect to the same BCLK signal arriving on a different DC chip. Since host 114 needs to obtain data from all the DC chips of the memory buffer chip simultaneously, the skew introduced by the BCLK signal arriving on one DC chip at one time and another DC chip at another time increase the impact of skew on the latency of a read data return path of the memory buffer chip. In one example, HSS signal 532 is illustrated as a signal consistent with HSS signal 512 and HSS signal 522. DQS0 534 and DQS1 536 reflect the skewed signals of DQS0 524 and DQS1 526. In addition, in timing diagram 530, multiple BCLK signals are illustrated. A BCLK1 538 signal represent a BCLK signal arriving at a first DC chip in a first port and BCLK2 540 signal represent the BCLK signal arriving at a second DC chip in a second port. In one example, BCLK 1 538 and BCLK2 540 are skewed, introducing additional clock cycles of latency into the read data path, in addition to the additional clock cycles of latency introduced by the DQS skew, requiring additional cycles of latency to be added, to deskew and align data from multiple ports, such that a cohesive cache line can be delivered.

Figure 6:
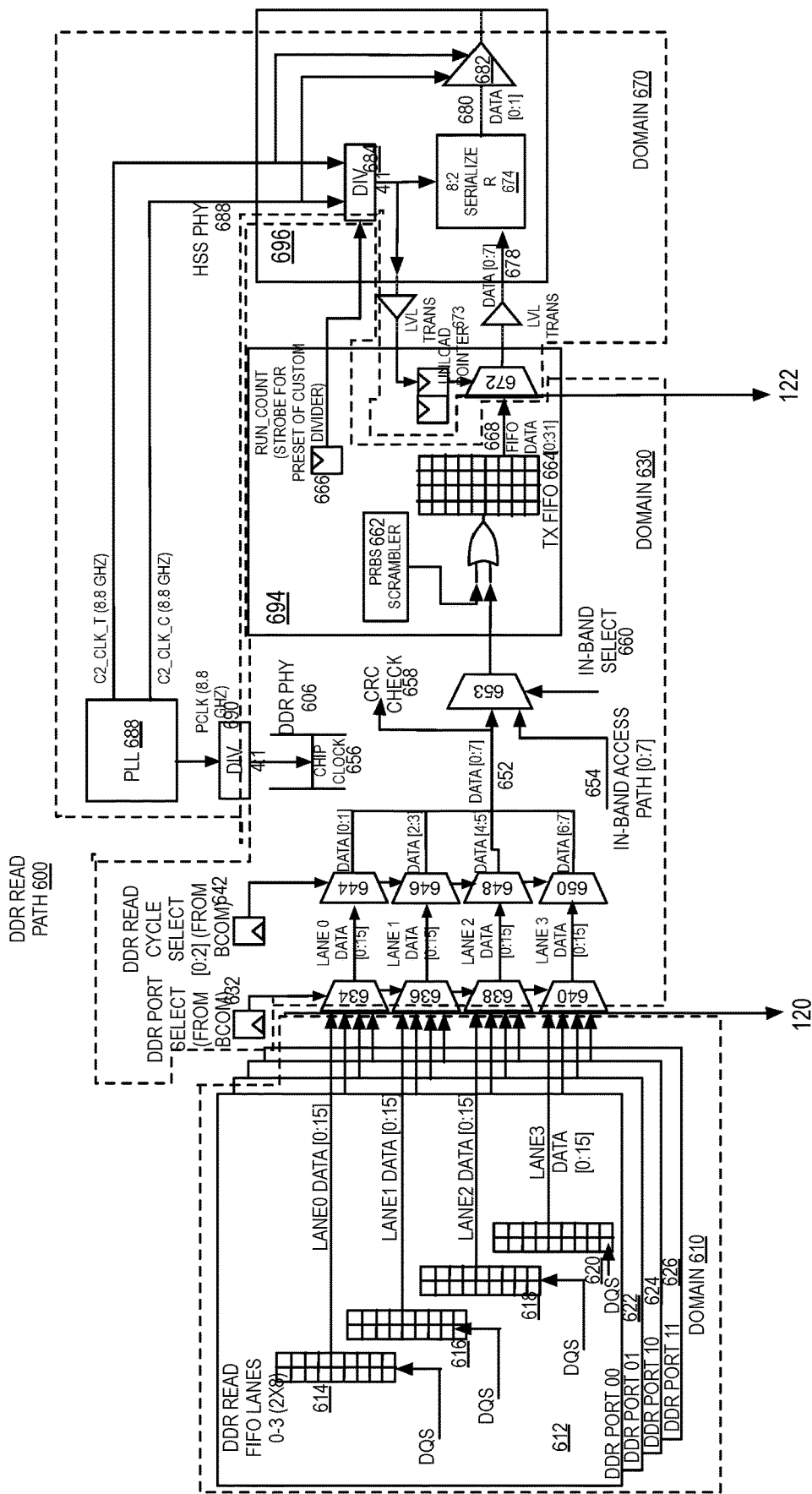
FIG. 6 illustrates a block diagram of one example of a DDR read path of an HSS interface optimized for multiple memory buffer chips in a multi-port system.

FIG. 6 illustrates a block diagram of one example of a DDR read path of an HSS interface optimized for multiple memory buffer chips in a multi-port memory buffer system.

In one example, a first domain 610 of a DDR read path 600 may represent a memory FIFO 130, supporting multiple memory buffer chips, in a multi-port memory buffer system. In one example, first domain includes multiple DDR read FIFOs, for each DDR port. For example, a DDR port 00 612 includes a DDR read FIFO 614, a DDR read FIFO 616, a DDR read FIFO 618, and a DDR read FIFO 620. In one example, each of the DDR read FIFOs of DDR port 00 612 are specified for one of a selection of 4 HSS interface lanes in each memory buffer chip, numbered 0-3, with a 2×8 buffer, for holding 16 bits of data. For example, DDR read FIFO 614 holds lane 0 data, DDR read FIFO 616 holds lane 1 data, DDR read FIFO 618 holds lane 2 data, and DDR read FIFO 620 holds lane 3 data. In one example, each "lane" may represent a nibble or byte of data, where depending on the type of DRAM device, such as an X4 or X8 device type, a separate read FIFO may be implemented to handle each nibble or byte of data supported in parallel on the memory buffer chip. In one example, each of the DDR read FIFOs for each of DDR port 00 620, DDR port 01 622, DDR port 10 624, and DDR port 11 626, may receive a DQ signal as a data input, with buffering, as illustrated with respect to the DQ signal in FIG. 4, and may receive a DQS signal as a clock input, including buffering and phase adjustment, as illustrated with respect to the DQS signal in FIG. 4.

In one example, depending on the skew between DQS signals of each of the DDR read FIFOs of each port, data may be clocked into the DDR read FIFOs for each lane of each port at different times. In one example, data cross from the DDR read FIFOs across clock boundary 120 and are latched and multiplexed by each of the DDR port mux based on a DDR port select 632, from the BCOM signal. In the example, the DDR port mux include a mux 634 for lane 0 data from each port, a mux 636 for lane 1 data from each port, a mux 636 for lane 2 data from each port, and a mux 640 for lane 3 data from each port. In one example, a DDR port select 832, provides a selection of inputs by port, for each lane, to mux 634, mux 636, mux 638, and mux 640, based on the BCOM signal for controlling the data commands by port. In one example, DDR port select 632 may determine which beats of data to read out of each DDR read FIFO, where each DDR read FIFO may hold 2 beats of data, where each DRAM may return 8 beats of data, such that DDR port selection 632 may cycle through 4 FIFO entries, or slots, to obtain a cohesive line of data.

In one example, returning to domain 630, the selected lane outputs from the DDR port mux is received as input to DDR read cycle mux and is latched by each of the DDR read cycle mux based on a DDR read cycle select 642, from the BCOM signal. In one example, the DDR read cycle mux may include a mux 644 for multiplexing lane 0 data [0:15] to data [0:1], a mux 646 for multiplexing lane 1 data [0:15] to data [2:3], a mux 648 for multiplexing lane 2 data [0:15] to data [4:5], and a mux 650 for multiplexing lane 3 data [0:15] to data [6:7]. In the present invention, based on an optimization by calibration controller 150, DDR port select 632 may read out 1-2 bytes from each FIFO, at the same time, perfectly aligned across all ports. In one example, the DDR read cycle select 642 may select between ports in a multi-port configuration and may be positioned based on one clock cycle of uncertainty in a local clock cycle selection.

In particular, in the example, chip clock 656 may distribute a PCLK signal divided by a 4:1 divider 690. In one example, chip clock 656 may drive a clock signal to all of the logic associated with unloading data from the DDR read FIFOs, such as DDR port select 632 and DDR read cycle select 642. In one example, in the present invention, to minimize latency on DDR read path 600, calibration controller 150 performs a phase alignment of chip clock 656 with respect to a latest arriving DQS signal at the DDR read FIFOs, also referred to as a latest arriving strobe.

In addition, chip clock 656 may drive a clock signal to the logic for controlling writing data into TX FIFO 664. In one example, run_count 666 may represent a strobe that is derived from chip clock 656. An unload pointer 673 is a function of run_count 666. As will be further described, calibration controller 150 performs a phase alignment to optimize the phase of assertion of an unload pointer 673 to control writing data into TX FIFO 664.

In one example, the data multiplexed from the DDR read cycle mux may be output as data [0:7] 652 and pass through eight data wires, routed at chip level and captured synchronously. In one example, a mux 653 receives the data [0:7] 652 as one input and receives an in-band access path [0:7] 654 as another input. In one example, an in-band select 660 is a pointer into mux 653 to select between data [0:7] 652 and in-band access path [0:7] 654. In one example, in-band access path [0:7] 654 may be selected for enabling the host firmware (FW) to access information inside the memory buffer chip through DDR read path 600, in-band, through the same channels as the ports. The host FW may use in-band access path [0:7] 654 for sending read and write operations that target internal FW registers, as opposed to memory. In one example, FW operations may be infrequent and may not be critical for performance, such as FW operations during memory interface calibration, so FW operations may be routed through a different clock distribution that runs at a slower frequency with asynchronous boundaries, to save power, regardless of which speed memory is configured in the system. In one example, in-band access path [0:7] 654 may not be affected by updates performed to the phases of chip clock 656 by calibration controller 150 and if the new phases optimized by calibration controller 150 result in adding more latency to FW operations, given that FW operations are infrequent and not performance critical, the additional latency to FW operations does not significantly impact the overall performance of the memory buffer system. In one example, data [0:7] 652 may also be output to cyclic redundancy check (CRC) check 658. In one example, a CRC check may represent an error detecting code used to detect accidently changes in data.

In one example, the output of mux 653 is logically OR'd with an output from a pseudo-random binary sequence (PRBS) scrambler 662 into a TX FIFO 664. In one example, PRBS scrambler 662 may transform the input data stream for ensuring accurate recovery on a receiver, such as the host, where the host may implement a receiving LFSR to descramble the scrambled input data stream based on a sync-word between PRBS scrambler 662 and a receiving LFSR.

In one example, TX FIFO 664 may include a 32 bit buffer and output FIFO data [0:31] 668. In one example, FIFO data [0:31] 668 crosses clock boundary 122 from domain 630 to a domain 670. In one example, a mux 672 latches a selection of FIFO data [0:31] 668 based on an unload pointer input and passes a selection of 8 bits of data through a voltage levels LVL TRANS buffer, as data [0:7] 678, based on an unload pointer signal. In one example, a 4:1 divider 684 may divide a clock signal received from PLL 688, to drive the unload pointer to mux 672. In one example, the divided clock signal passes through a voltage level LVL TRANS buffer to an unload pointer count.

In one example, an 8:2 serializer 674 receives data [0:7] 678 and serializes the data into 1 bit serial data [0:1] 680. In one example, an amplifier 682 amplifies the frequency of data [0:1] 680 by the frequency of the signals output from a PLL 688.

In one example, while PLL 688 may drive both an HSS clock, illustrated by C2_CLK_T and C2_CLK_C, and a DC chip clock 656, illustrated by PCLK, the HSS clock and DC chip clock do not originally have a known phase relationship. In particular, in the example, referring back to FIG. 2, calibration controller 150 may first initialize AC 230 to establish internal clocks and a communication path to the DC chips in DC set 220 and DC set 222. In one example, initializing AC 230 may include starting AC clocks, including BCLK 231, sending the BCLK signal to each of the DCs in DC set 220 and DC set 222 and establishing the BCOM signal between AC 230 and each of the DCs in DC set 220 and DC set 222. In one example, part of the AC chip initialization performed by calibration controller 150 may include training the HSS interface and establishing internal AC clock phases. In addition, calibration controller 150 may initially initialize the DCs in DC set 220 and DC set 222 to establish an access path needed for memory interface initialization and training. At this point, the HSS interface between the DCs and the host could also be trained, however, doing so would likely result in non-optimized clock crossings which contribute to additional latency in DDR read path 600.

In the example, calibration controller 150 optimizes phase alignments between memory buffer chips and host through DDR read path 600 by foregoing the initial HSS interface training of DDR read path 600 between the DC chips and the host prior to memory interface initialization and training. Calibration controller 150 uses the AC trained HSS interface and the BCOM signal for memory interface training and training for both the AC and DC chips. In the example, the memory interface training and training for both the AC and DC chips may include, but is not limited to, write leveling, strobe alignment, internal DDR PHY clock alignment at chip clock 656, and read leveling. As a result of the memory interface training and training for both the AC and DC chips, a fixed relationship is established between the incoming data strobe DQS on each DC chip, the memory clock emanating from the AC, and the internal AC clock.

In particular, in the example illustrated in FIG. 2, since each DC chip internal clock is sourced from the AC as BCLK, under perfect operating conditions, the DC internal clock for generating DQS would be phase aligned to the AC internal clock. In reality, the presence of skew between the AC chip and the multitude of DC chips, the transmission medium, and the presence of the PLL within the DC chip all conspire to shift the relationship of DC clocks with respect to AC clocks. As a result, the chip clock 656 in DDR read path 600 will likely not be aligned with the incoming data strobe DQS, and its corresponding DDR PHY read clock.

In the present invention, in a similar manner as described with reference to FIG. 4, calibration controller 150 is optimized to minimize the latency through the DDR read FIFOs on multiple DDR ports and TX FIFO 664 by optimizing various clock phases. Calibration controller 150 first implements a circuit to assess the arrival times of the DC data strobes from the DQS signal, upon completion of the memory interface training. Next, calibration controller 150 determines whether external feedback is required. If the memory topology of the memory buffer chip is a distributed memory buffer topology, as described in FIG. 2, external feedback is required to manage for skew among the DC chips for PLL 688. If the memory topology of the memory buffer chips is a unified memory buffer topology, as described in FIG. 3, then external feedback is not likely required.

In one example, if external feedback control is not required, as previously described with reference to FIG. 4, calibration controller 150 may adjust a phase of chip clock 658 to align to the latest strobe and may adjust DC chip write clock phase rotators. In particular, adjusting a phase of chip clock 658 to align to the latest strobe minimizes the amount of time the read data must remain in the read FIFOs before being unloaded and transmitted to TX FIFO 664. However, the DC chip clock adjustment may upset the prior relationships that were established during memory interface calibration, thereby obviating several results. To compensate for the adjustments, the AC chip memory write clock and command/address/control phase rotators may be adjusted by an amount corresponding to the applied DC chip clock phase shift. In the example, the DC clocks may be shifted with any desired granularity depending on the implementation complexity. For example, delay lines may be used to provide four phases separated by 90 degrees, or phase rotators could be used to achieve a larger number of phases.

In one example, if external feedback is required, calibration controller 150 may apply a 180 degree phase shift, or full inversion, of the alternate edge of DC chip clock 656, by selecting a simple selectable inversion. Allowing the full inversion may also require additional circuit logic to permit unloading the DDR FIFO either through rising or falling edge capture latches. In the example, the inversion option is simpler and less costly to implement, however, may also provide a maximum latency reduction of half a clock cycle.

In one example, to determine the latest strobe, one or more of hardware and software may be implemented. In one example, read data path 400 may include additional hardware circuits for monitoring the DQS signals to identify the latest arriving strobe. In another example, software or firmware may capture information about each DQS strobe and capture the delay information, analyze the captured information, and determine which DQS is the latest strobe.

In the example, calibration controller 150 further minimizes the latency through FIFO 664, across clock domain 120 by using the previously adjusted phase of DC chip clock 656. In one example, calibration controller 150 may next run an HSS training set that compares the current TX launch clock phase driven to run_count strobe 666, as driven by the recently adjusted phase of DC chip clock 656. In particular, to account for a quarter cycle of clock uncertainty in the clock cycle selection for the unload pointer, the phase of 4:1 divider 684 may be calibrated during training using run_count 666, as a strobe from DC chip clock 656. In particular, calibration controller 150 may compare a current TX launch clock phase to run_count 666, and set a phase of 4:1 divider 684 of unload pointer 673, to optimize the phase of unload pointer 673 and to minimize the amount of time from when the data are written into TX FIFO 664 by unload pointer 673 to when data are unloaded and transmitted to the host.

In one example, a selection of components 694 of DDR read path 600 may represent a first transmit differential memory interface (DMI) and a selection of components 696 of DDR read path 600 may represent a second transmit DMI. In one example, a DMI may represent a physical layer interface that enables the transport of memory command, address, and data encapsulated in frames through high speed Serdes links to and from the host CPU.

In one example, in view of the clock and strobe misalignment from DQS skew that is introduced in real time conditions in timing diagram 520 and in view of the additional clock and strobe misalignment from DQS skew and BCLK skew that is introduced in a multiport system with multiple memory buffer chips in timing diagram 530, by implementing calibration controller 150 of the present invention to optimize phase alignment also optimizing the components of the memory interface, the internal data path, and the HSS interface to enable calibration controller 150 to further optimize phase alignment, calibration controller 150 may minimize the delays introduced in the read path from data buffers and crossing multiple clock boundaries between memory buffer chips and a host through an HSS interface.

Figure 7:
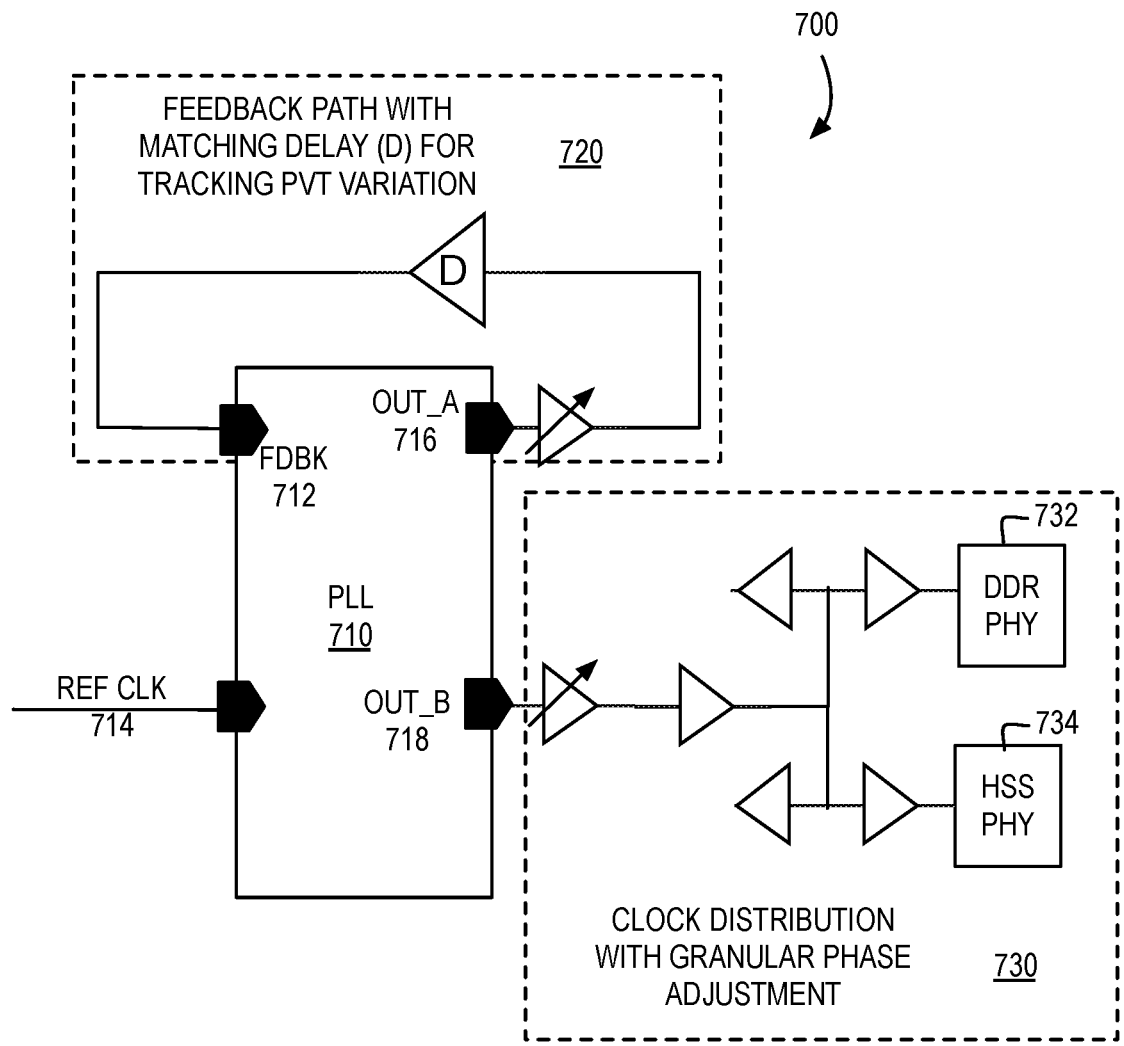
FIG. 7 illustrates a block diagram of one example of external feedback control of a PLL.

FIG. 7 illustrates one example of a block diagram of external feedback control of a PLL.

In one example, external feedback control of a PLL 700 illustrates an example of a PLL 720 implemented with a feedback path 720, in the event that a DC chip clock requires an additional external feedback mechanism for a PLL, to compensate for the adjustments to prior relationships established during memory interface calibration.

In one example, a PLL 710 may receive a clock signal of REF CLK 714, which is driven by the BCLK. In one example, PLL 710 may include a feedback pin (FDBK) 712. In one example, PLL 710 include two outputs, illustrated as an "out_A" 716 and an "out_B" 718.

In one example, regardless of whether an external feedback path exists or not, "out_A" 716 may be used as the high speed (8 Ghz) output from PLL 424 to divider 4:1 434 to specifically driver 8:2 serializer 432 or high speed output "C2_CLK_T" from PLL 688 input to divider 4:1 684 to specifically driver 8:2 serializer 674.

In one example, in the present invention, as to "out_B" 718, calibration controller 150 may run memory interface training and determine a latest arriving strobe. PLL 710 may perform clock distribution with fine granular phase adjustment on DDR PHY 732 to align an internal clock tree 730 connected to "out_B" 718 to the latest arriving strobe. In one example, DDR PHY 732, may represent the clock phase at chip clock 422 and chip clock 656. In the example, since internal clock tree 730 is not connected to FDBK 712, the alignment of internal clock tree 730 will remain intact. Next, during DC HSS training, calibration controller 150 may use the new core clock alignment of internal clock tree 730 to match up to the TX clock of HSS PHY 734. In one example, HSS PHY 734 may represent the clock phase arriving at 4:1 divider 434 and the clock phase on C2_CLK_C 688, arriving at 4:1 divider 684. The result is a phase aligned path from the latest arriving strobe in the first domain, to the FIFO read pointer for reading from the read FIFO into the second domain, to the unload pointer for reading from the TX FIFO into the third domain.

In the example, PLL 710 may include a feedback path 720 for handling any future process, voltage, and temperature (PVT) variation that may occur that would endanger calibration results. In the example, in the event of PVT variation, in one example, calibration controller 150 may trigger an external feedback path 720, from "out_A" 716, to null out the PVT variation. In one example, external feedback path 720 may include a feedback path with matching delay (D) for tracking PVT variation.

Figure 8:
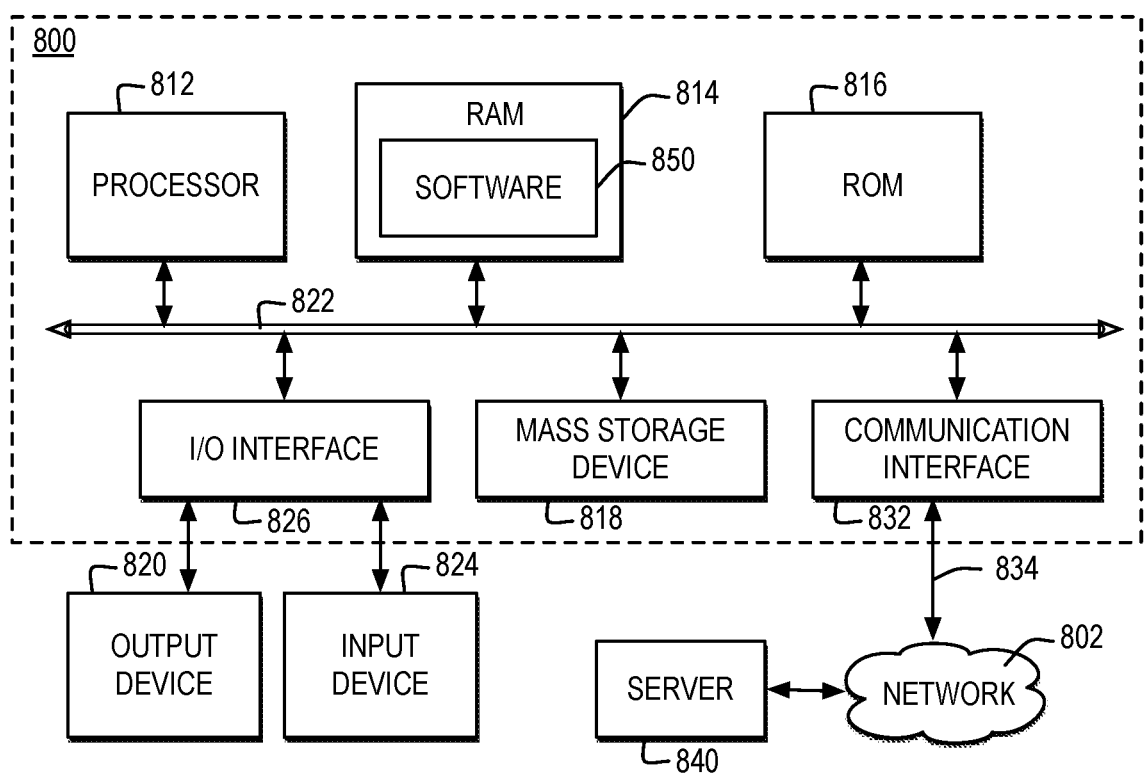
FIG. 8 is a block diagram illustrating one example of a computer system in which one embodiment of the invention may be implemented.

FIG. 8 illustrates a block diagram of one example of a computer system in which one embodiment of the invention may be implemented. The present invention may be performed in a variety of systems and combinations of systems, made up of functional components, such as the functional components described with reference to a computer system 800 and may be communicatively connected to a network, such as network 802.

Computer system 800 includes a bus 822 or other communication device for communicating information within computer system 800, and at least one hardware processing device, such as processor 812, coupled to bus 822 for processing information. Bus 822 preferably includes low-latency and higher latency paths that are connected by bridges and adapters and controlled within computer system 800 by multiple bus controllers. When implemented as a server or node, computer system 800 may include multiple processors designed to improve network servicing power.

Processor 812 may be at least one general-purpose processor that, during normal operation, processes data under the control of software 850, which may include at least one of application software, an operating system, middleware, and other code and computer executable programs accessible from a dynamic storage device such as random access memory (RAM) 814, a static storage device such as Read Only Memory (ROM) 816, a data storage device, such as mass storage device 818, or other data storage medium. Software 850 may include, but is not limited to, code, applications, protocols, interfaces, and processes for controlling one or more systems within a network including, but not limited to, an adapter, a switch, a server, a cluster system, and a grid environment.

Computer system 800 may communicate with a remote computer, such as server 840, or a remote client. In one example, server 840 may be connected to computer system 800 through any type of network, such as network 802, through a communication interface, such as network interface 832, or over a network link that may be connected, for example, to network 802.

In the example, multiple systems within a network environment may be communicatively connected via network 802, which is the medium used to provide communications links between various devices and computer systems communicatively connected. Network 802 may include permanent connections such as wire or fiber optics cables and temporary connections made through telephone connections and wireless transmission connections, for example, and may include routers, switches, gateways and other hardware to enable a communication channel between the systems connected via network 802. Network 802 may represent one or more of packet-switching based networks, telephony based networks, broadcast television networks, local area and wire area networks, public networks, and restricted networks.

Network 802 and the systems communicatively connected to computer 800 via network 802 may implement one or more layers of one or more types of network protocol stacks which may include one or more of a physical layer, a link layer, a network layer, a transport layer, a presentation layer, and an application layer. For example, network 802 may implement one or more of the Transmission Control Protocol/Internet Protocol (TCP/IP) protocol stack or an Open Systems Interconnection (OSI) protocol stack. In addition, for example, network 802 may represent the world-wide collection of networks and gateways that use the TCP/IP suite of protocols to communicate with one another. Network 802 may implement a secure HTTP protocol layer or other security protocol for securing communications between systems.

In the example, network interface 832 includes an adapter 834 for connecting computer system 800 to network 802 through a link and for communicatively connecting computer system 800 to server 840 or other computing systems via network 802. Although not depicted, network interface 832 may include additional software, such as device drivers, additional hardware and other controllers that enable communication. When implemented as a server, computer system 800 may include multiple communication interfaces accessible via multiple peripheral component interconnect (PCI) bus bridges connected to an input/output controller, for example. In this manner, computer system 800 allows connections to multiple clients via multiple separate ports and each port may also support multiple connections to multiple clients.

Figure 9:
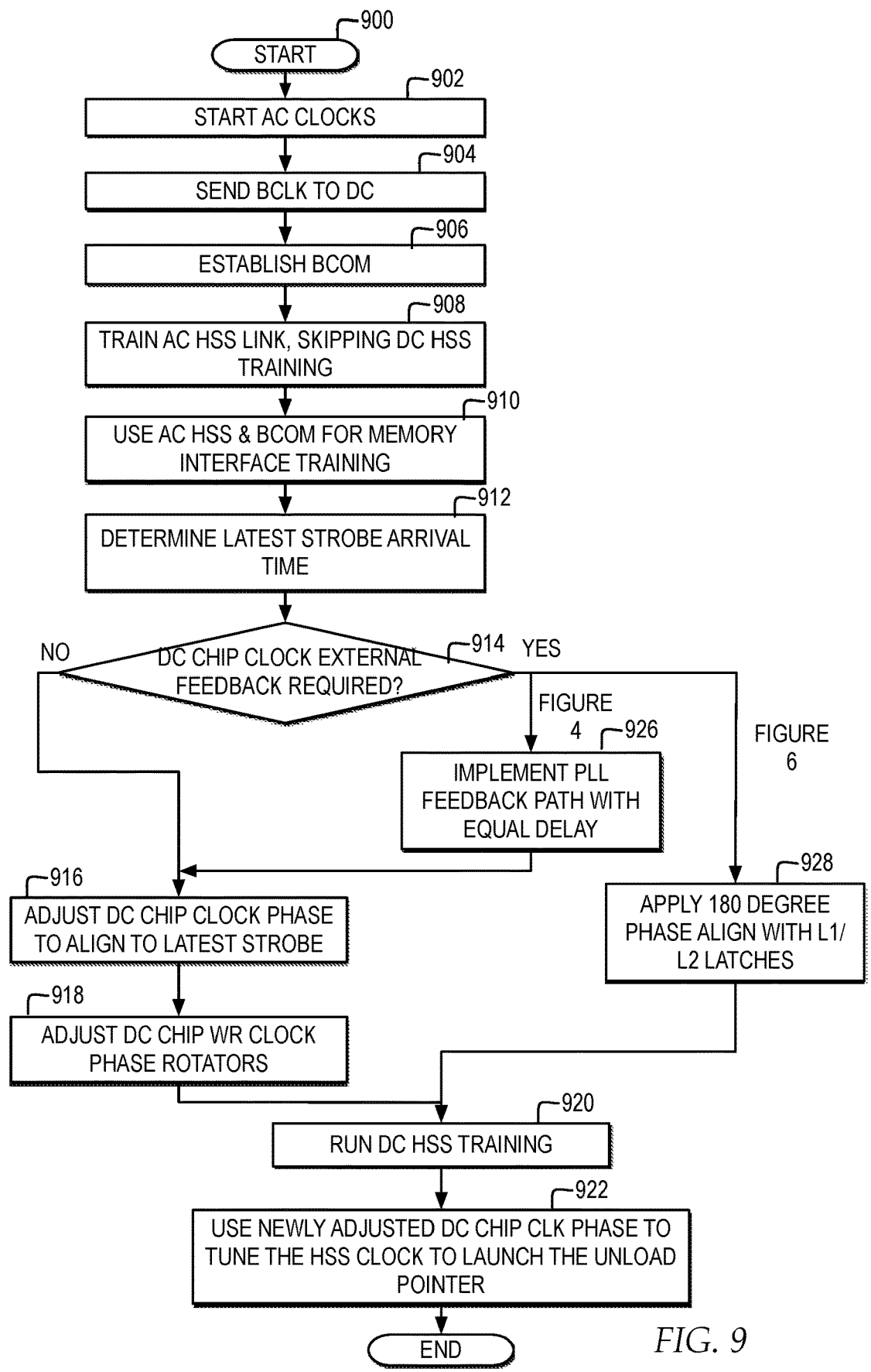
FIG. 9 illustrates a high level logic flowchart of a process and computer program for optimizing a read data path between one or more memory buffer chips of a memory buffer system operating under a particular memory protocol and a memory protocol agnostic host employing an HSS interface.

In one embodiment, the operations performed by processor 812 may control the operations of flowchart of FIG. 9 and other operations described herein. Operations performed by processor 812 may be requested by software 850 or other code or the steps of one embodiment of the invention might be performed by specific hardware components that contain hardwired logic for performing the steps, or by any combination of programmed computer components and custom hardware components. In one embodiment, one or more components of computer system 800, or other components, which may be integrated into one or more components of computer system 800, may contain hardwired logic for performing the operations of flowcharts in FIG. 9.

In addition, computer system 800 may include multiple peripheral components that facilitate input and output. These peripheral components are connected to multiple controllers, adapters, and expansion slots, such as input/output (I/O) interface 826, coupled to one of the multiple levels of bus 822. For example, input device 824 may include, for example, a microphone, a video capture device, an image scanning system, a keyboard, a mouse, or other input peripheral device, communicatively enabled on bus 822 via I/O interface 826 controlling inputs. In addition, for example, output device 820 communicatively enabled on bus 822 via I/O interface 826 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 8, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 8 may vary. Furthermore, those of ordinary skill in the art will appreciate that the depicted example is not meant to imply architectural limitations with respect to the present invention.

FIG. 9 illustrates a high level logic flowchart of a process and computer program for optimizing a read data path between one or more memory buffer chips of a memory buffer system operating under a particular memory protocol and a memory protocol agnostic host employing an HSS interface.

As illustrated, in one example, a process and computer program begin at block 900 and thereafter proceed to block 902. Block 902 illustrates starting one or more AC clocks, such as a clock of AC 230 in FIG. 2. Next, block 904 illustrates sending a BCLK signal to the DC, such as DC set 220 and DC set 222 in FIG. 2. Thereafter, block 906 illustrates establishing the BCOM signal from the AC to each DC, such as to of DC set 220 and DC set 222. In one example, the processes described in block 902, block 904, and block 906 may be performed concurrently.

Block 908 illustrates training an AC HSS link, but skipping DC HSS training. Next, block 910 illustrates using the AC HSS link and BCOM for memory interface training.

Thereafter, block 912 illustrates determining a latest strobe arrival time, and the process passes to block 914.

Block 914 illustrates a determination whether DC chip clock external feedback is required. At block 914, if no DC chip clock external feedback is required, then the process passes to block 916. Block 916 illustrates adjusting a DC chip clock phase to align to the latest strobe. Next, block 918 illustrates adjusting the DC chip WR clock phase rotators, and the process passes to block 920.

Returning to block 914, if DC chip clock external feedback is required, then the process passes either passes to block 926, for the configuration illustrated in FIG. 4 or passes to block 928, for the configuration illustrated in FIG. 6. Block 926 illustrates implementing the PLL feedback path with matching delay, and the process passes to block 916. Alternatively, block 928 illustrates applying a 180-degree phase alignment with the L1 and L2 latches, and the process passes to block 920.

Block 920 illustrates running DC HSS training. Next, block 922 illustrates using the newly adjusted DC chip clock phase to tune the HSS clock to launch the unload pointer, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method comprising:
   determining, by a computer system, a latest arriving data strobe from at least one data chip at a first data buffer in a read data path between at least one memory chip and a host on a high speed interface;
   determining, by the computer system, whether external feedback of the at least one data chip is required; and
   in response to determining that external feedback of the at least one data chip is required, aligning, by the computer system, a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

2. The method according to claim 1, further comprising:
   starting, by the computer system, a buffer clock by an address chip of a memory buffer system comprising the at least one memory chip;
   sending, by the computer system, the buffer clock signal to at least one data chip of the memory buffer system, the buffer clock driving a phase locked loop of the at least one data chip, which drives the chip clock;
   establishing, by the computer system, a broadcast command signal from the address chip to the at least one data chip;
   training, by the computer system, a link between the address chip and the read data path;
   training, by the computer system, a memory interface of the memory buffer system to enable read and write data paths from the at least one data chip;
   determining, by the computer system, an arrival time of the latest arriving data strobe from the at least one data chip; and
   determining, by the computer system, whether external feedback of the at least one data chip is required.

3. The method according to claim 2, further comprising:
   in response to determining external feedback of the at least one data chip is not required, adjusting, by the computer system, a phase of the chip clock to align to a phase of the latest arriving strobe; and
   adjusting, by the computer system, one or more phases of a write clock of the data chip.

4. The method according to claim 2, further comprising:
   in response to determining external feedback of the at least one data chip is required, implementing, by the computer system, a phase locked loop feedback path with equal delay to adjust the phase lock loop phase;
   adjusting, by the computer system, a phase of the chip clock to align to a phase of the latest arriving strobe; and
   adjusting, by the computer system, one or more phases of a write clock of the data chip.

5. The method according to claim 1, further comprising:
   aligning, by the computer system, the chip clock with a high speed clock for controlling an unload pointer to unload the data from the second data buffer to a serializer in the read data path, wherein the data cross a second clock boundary from the second data buffer to the serializer, to minimize a latency in the read data path across a second clock boundary by:

training, by the computer system, a link between the at least one data chip and the serializer; and using, by the computer system, the chip clock, aligned by the latest arriving data strobe, to tune the launch clock to minimize a number of clock cycles between the data loading into the second data buffer and the data crossing the second clock boundary to the serializer in response to the high speed clock.

6. The method according to claim 1, further comprising:

applying, by the computer system, the 180 degree phase align of an alternate edge of the chip clock through one or more latches for unloading the data on one of the rising edge and falling edge of the one or more latches.

7. The method according to claim 1, further comprising:

training, by the computer system, the read data path for minimizing latency along the read data path for a read tag response from the memory chip to an asynchronous read request from the host.

8. The method according to claim 1, wherein determining, by a computer system, a latest arriving data strobe from at least one data chip at a first data buffer in a read data path between at least one memory chip and a host on a high speed interface further comprises:

determining, by the computer system, the latest arriving data strobe at the first data buffer in a read data path between the at least one memory chip implementing a synchronous double data rate protocol and the host which is agnostic to the synchronous double data rate protocol, wherein the high speed interface is a SerDes based high speed interface, wherein a read data return on the read data path transmits the data outside the boundaries of the synchronous double data rate protocol.

9. A computer system comprising one or more processors, one or more computer-readable memories, one or more computer-readable storage devices, and program instructions, stored on at least one of the one or more storage devices for execution by at least one of the one or more processors via at least one of the one or more memories, the stored program instructions comprising:

program instructions to determine a latest arriving data strobe from at least one data chip at a first data buffer in a read data path between at least one memory chip and a host on a high speed interface;

program instructions to determine whether external feedback of the at least one data chip is required; and program instructions, in response to determining that external feedback of the at least one data chip is required, to align a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

10. The computer system according to claim 9, the stored program instructions further comprising:

program instructions to start a buffer clock by an address chip of a memory buffer system comprising the at least one memory chip;

program instructions to send the buffer clock signal to at least one data chip of the memory buffer system, the buffer clock driving a phase locked loop of the at least one data chip, which drives the chip clock;

program instructions to establish a broadcast command signal from the address chip to the at least one data chip;

program instructions to train a link between the address chip and the read data path;

program instructions to train a memory interface of the memory buffer system to enable read and write data paths from the at least one data chip;

program instructions to determine an arrival time of the latest arriving data strobe from the at least one data chip; and program instructions to determine whether external feedback of the at least one data chip is required.

11. The computer system according to claim 10, the stored program instructions further comprising:

program instructions to, in response to determining external feedback of the at least one data chip is not required, adjust a phase of the chip clock to align to a phase of the latest arriving strobe; and program instructions to adjust one or more phases of a write clock of the data chip.

12. The computer system according to claim 10, the stored program instructions further comprising:

program instructions to, in response to determining external feedback of the at least one data chip is required, implement a phase locked loop feedback path with equal delay to adjust the phase lock loop phase;

program instructions to adjust a phase of the chip clock to align to a phase of the latest arriving strobe; and program instructions to adjust one or more phases of a write clock of the data chip.

13. The computer system according to claim 9, the stored program instructions further comprising:

program instructions to align the chip clock with a high speed clock for controlling an unload pointer to unload the data from the second data buffer to a serializer in the read data path, wherein the data cross a second clock boundary from the second data buffer to the serializer, to minimize a latency in the read data path across a second clock boundary further comprising:

program instructions to train a link between the at least one data chip and the serializer; and program instructions to use the chip clock, aligned by the latest arriving data strobe, to tune the launch clock to minimize a number of clock cycles between the data loading into the second data buffer and the data crossing the second clock boundary to the serializer in response to the high speed clock.

14. The computer system according to claim 9, the stored program instructions further comprising:

program instructions to apply the 180 degree phase align of an alternate edge of the chip clock through one or more latches for unloading the data on one of the rising edge and falling edge of the one or more latches.

15. The computer system according to claim 9, the stored program instructions further comprising:

program instructions to train the read data path for minimizing latency along the read data path for a read tag response from the memory chip to an asynchronous read request from the host.

16. The computer system according to claim 9, wherein the program instructions to determine a latest arriving data strobe from at least one data chip at a first data buffer in a read data path between at least one memory chip and a host on a high speed interface further comprise:

program instructions to determine the latest arriving data strobe at the first data buffer in a read data path between the at least one memory chip implementing a synchronous double data rate protocol and the host which is agnostic to the synchronous double data rate protocol, wherein the high speed interface is a SerDes based high speed interface, wherein a read data return on the read data path transmits the data outside the boundaries of the synchronous double data rate protocol.

17. A computer program product comprising one or more computer-readable storage devices and program instructions, stored on at least one of the one or more storage devices, the stored program instructions comprising:

program instructions to determine a latest arriving data strobe from at least one data chip at a first data buffer in a read data path between at least one memory chip and a host on a high speed interface;

program instructions to determine whether external feedback of the at least one data chip is required; and program instructions, in response to determining that external feedback of the at least one data chip is required, to align a chip clock distributed to a second data buffer in the read data path with the latest arriving data strobe by applying a 180 degree phase align of the chip clock through one or more latches, wherein data cross a first clock boundary from the first data buffer to the second data buffer, to minimize a latency in the read data path across the first clock boundary.

18. The computer program product according to claim 17, the stored program instructions further comprising:

program instructions to start a buffer clock by an address chip of a memory buffer system comprising the at least one memory chip;

program instructions to send the buffer clock signal to at least one data chip of the memory buffer system, the buffer clock driving a phase locked loop of the at least one data chip, which drives the chip clock;

program instructions to establish a broadcast command signal from the address chip to the at least one data chip;

program instructions to train a link between the address chip and the read data path;

program instructions to train a memory interface of the memory buffer system to enable read and write data paths from the at least one data chip;

program instructions to determine an arrival time of the latest arriving data strobe from the at least one data chip; and program instructions to determine whether external feedback of the at least one data chip is required.

19. The computer program product according to claim 17, the stored program instructions further comprising:

program instructions to, in response to determining external feedback of the at least one data chip is not required, adjust a phase of the chip clock to align to a phase of the latest arriving strobe; and program instructions to adjust one or more phases of a write clock of the data chip.

20. The computer program product according to claim 17, the stored program instructions further comprising:

program instructions to, in response to determining external feedback of the at least one data chip is required, implement a phase locked loop feedback path with equal delay to adjust the phase lock loop phase;

program instructions to adjust a phase of the chip clock to align to a phase of the latest arriving strobe; and program instructions to adjust one or more phases of a write clock of the data chip.

* * * * *